United States Patent [19]
Cutts et al.

[11] Patent Number: 5,412,534
[45] Date of Patent: May 2, 1995

[54] MODULAR HOUSING

[75] Inventors: Stanley J. Cutts, Winchester; David Gaunt, Southampton; Ian Golledge, Romsey; Albert Hamper, Fareham, all of England; Eric Johnson, Greene, N.Y.; David Newmarch, Romsey; John Veal, Southampton, both of England

[73] Assignee: International Business Machines Corporation, Armonk, N.Y.

[21] Appl. No.: 214,719

[22] Filed: Mar. 17, 1994

[30] Foreign Application Priority Data

Mar. 20, 1993 [GB] United Kingdom ............... 9305834

[51] Int. Cl.6 ................................. H05K 7/20
[52] U.S. Cl. ...................... 361/695; 361/687
[58] Field of Search ................ 361/683–688, 361/691–697, 725, 727, 730, 735, 796

[56] References Cited

U.S. PATENT DOCUMENTS 3,868,158  2/1975  Laboue ..................... 312/350
4,648,007  3/1987  Garner ..................... 361/384
5,027,254  6/1991  Corfits ..................... 361/796

FOREIGN PATENT DOCUMENTS 0442642  8/1991  European Pat. Off. .

Primary Examiner—Gregory D. Thompson
Attorney, Agent, or Firm—Owen J. Gamon

[57] ABSTRACT

A modular housing for first and second groups of replaceable functional units, e.g., disk files comprises a chassis for supporting the units within a first compartment extending along the length of a chassis support structure and removable via opposite openings in the chassis. Replaceable cooling and power supply assemblies are located within a second compartment of the drawer and can be removed from drawer via one of the openings without removing either of the groups of functional units. The fan of a combined cooling and power supply unit is arranged centrally within the second compartment such that it draws cooling air past the first group of units and exhausts air towards the second group of units.

12 Claims, 8 Drawing Sheets

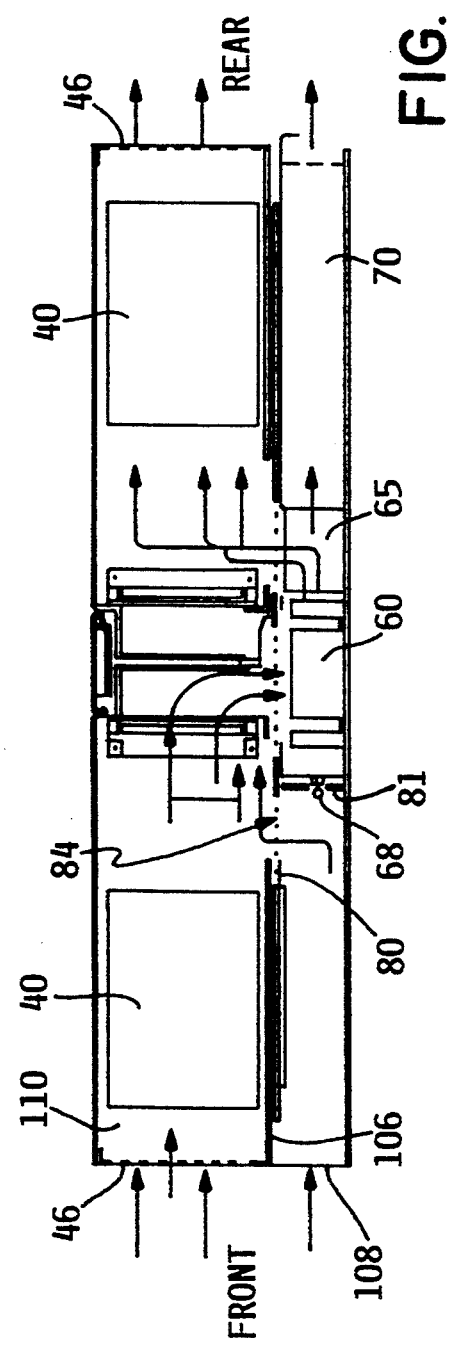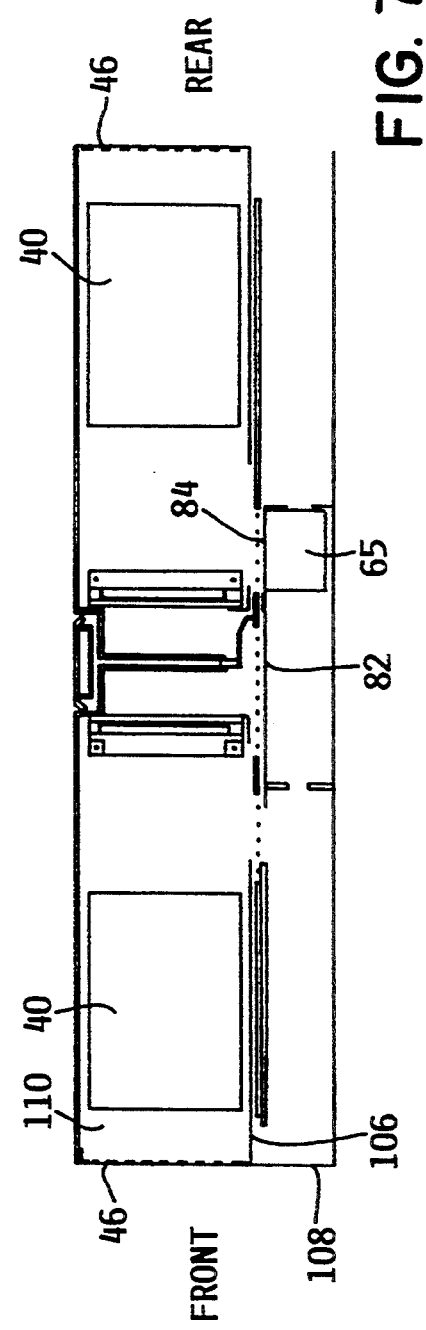

MODULAR HOUSING

FIELD OF THE INVENTION

The present invention relates to a modular housing and more particularly to the packaging and cooling of replaceable electrical units in such a housing.

BACKGROUND OF THE INVENTION

A current trend in the design of electrical systems is to modular system configurations wherein individual electrical units of the system are readily accessible and in some cases customer removable. The use of modular designs provides a number of different advantages. Manufacture and assembly is made simpler in that each unit can be manufactured and tested separately before being assembled in the complete system. Furthermore, if a removable unit becomes defective, it can be readily removed for repair and replaced with a working device. A typical multi-component system of this type is a computing system in which data storage devices, processing hardware, power supplies and cooling fans are contained within a single support structure.

Although ease of removability of individual devices is facilitated using a modular configuration, the removal and replacement of a device usually requires the system to be closed down thus reducing the amount of time for which the system is available. It would be desirable if a defective device could be removed and replaced while the system continued to function. In order to achieve this the system design should permit easy access to removable devices while at the same time ensuring that the system "life support" functions, e.g., cooling and power continue to operate. Taking the example of a disk file data storage system comprising removable disk files and associated power and cooling units, such systems are currently available which allow for the replacement of one or more of the disk files while maintaining operation of the remaining disk files. However, removal and replacement of a failed cooling fan or power supply generally necessitates the shutting down of the whole system.

It is increasingly common that such modular systems are required to conform to a industry standard size in order that they fit within a larger data processing system. In the case of disk file storage subsystems, one challenge faced by the designer of the subsystem power and packaging is to achieve a high packaging density within the available space in order to provide a high value for the ratio of megabytes to unit volume.

The designing of a system which allows easy replacement of system subassemblies with continued system availability and high subassembly packaging density is an ongoing problem and one which is difficult to achieve in practice.

SUMMARY OF THE INVENTION

The present invention seeks to provide a solution to this problem and accordingly provides a modular housing for first and second groups of replaceable heat-generating functional units, comprising: a support structure for supporting the two groups of functional units in the housing comprising a chassis in the form of a rectangular tube having first and second openings at opposite ends thereof, and including first and second compartments separated by an internal wall extending longitudinally at least part way along the length of the chassis to accommodate the first and second group of functional units within the first compartment on opposite sides of a central compartment of the chassis so as to be respectively removable via the first and second openings; at least two replaceable cooling units, which are removable via one of said chassis openings without removing either of the groups of functional units, the cooling units being arranged within the second compartment of the support structure adjacent to the central compartment in such a position that in operation they serve to draw air past the first group of units, through the cooling units and past the second group of units.

With such a housing arrangement, it is mechanically possible to remove selected functional units (e.g., data storage units) or cooling units without disturbing the remaining units. When one of the cooling units is removed, the other cooling unit will continue to operate and will provide cooling for the functional units. Furthermore, where the modular housing takes the form of a rack mountable drawer, it is possible to gain access to all units of the housing via front and rear openings of the drawer without the need to remove the drawer from the rack. If necessary the remaining cooling unit or units may be arranged to compensate for the removal of a cooling unit, e.g., by increasing the rotational speed of the remaining fan.

Although in some subsystems, the power supply to the functional and cooling units may be located outside of the housing, a preferred housing further includes at least two replaceable power supply units arranged within the second compartment of the chassis and removable via one of the chassis openings. If one of the power supply units were designed to provide sufficient power for the whole subsystem, then it would be possible to remove a defective power supply without impacting the availability of the subsystem.

In one configuration of the housing, the cooling units and power supplies are separate assemblies which can be removed from the chassis via different chassis openings. However, in a preferred arrangement, a cooling unit is mounted in tandem with a power supply unit to form a single assembly which can be removed via one of the chassis openings as a single field replaceable unit. This configuration permits easier access to the cooling unit buried in the center of the housing.

It would be possible to use an axial fan to provide cooling of the housing. However, in practice it has been found to be advantageous in terms of space to employ a centrifugal fan. It is preferred that each cooling unit comprises a centrifugal fan including an air inlet for receiving cooling air from the direction of the first group of replaceable units and deflection means arranged at the air outlet thereof to deflect a proportion of the air exiting the fan towards the second group of functional units. For the combined cooling unit and power supply arrangement, the flap is designed such that a proportion of the cooling air leaving the fan is undeflected by the flap in order to provide cooling for the power supply located downstream of the fan.

In the combined cooling and power supply unit, the flap which acts to divert a proportion of the cooling air towards the functional units of the second group is preferably arranged in the combined unit between the fan outlet and the power supply. It is preferred that the flap acts a valve in the event of failure of the cooling fan to close the outlet fan aperture.

Preferably a shutter arrangement is provided in the chassis between first and second compartments which closes on removal of a fan/power supply unit to prevent unwanted recirculation of air.

Although the functional units of the first and second groups may be individually pluggable into the chassis, it is preferred that the functional units of each of the first and second group are removably loaded into a replaceable module which includes autoplugging connectors at one end for mating with corresponding connectors within the central compartment of the housing. This arrangement permits the removal of the individual functional units as a complete disk pack module.

BRIEF DESCRIPTION OF THE DRAWINGS

FIGS. 7A and 7B are sectional schematic views of the subsystem of FIG. 1 showing the direction of cooling air flow through the chassis;

DETAILED DESCRIPTION OF PREFERRED EMBODIMENT

Figure 1:
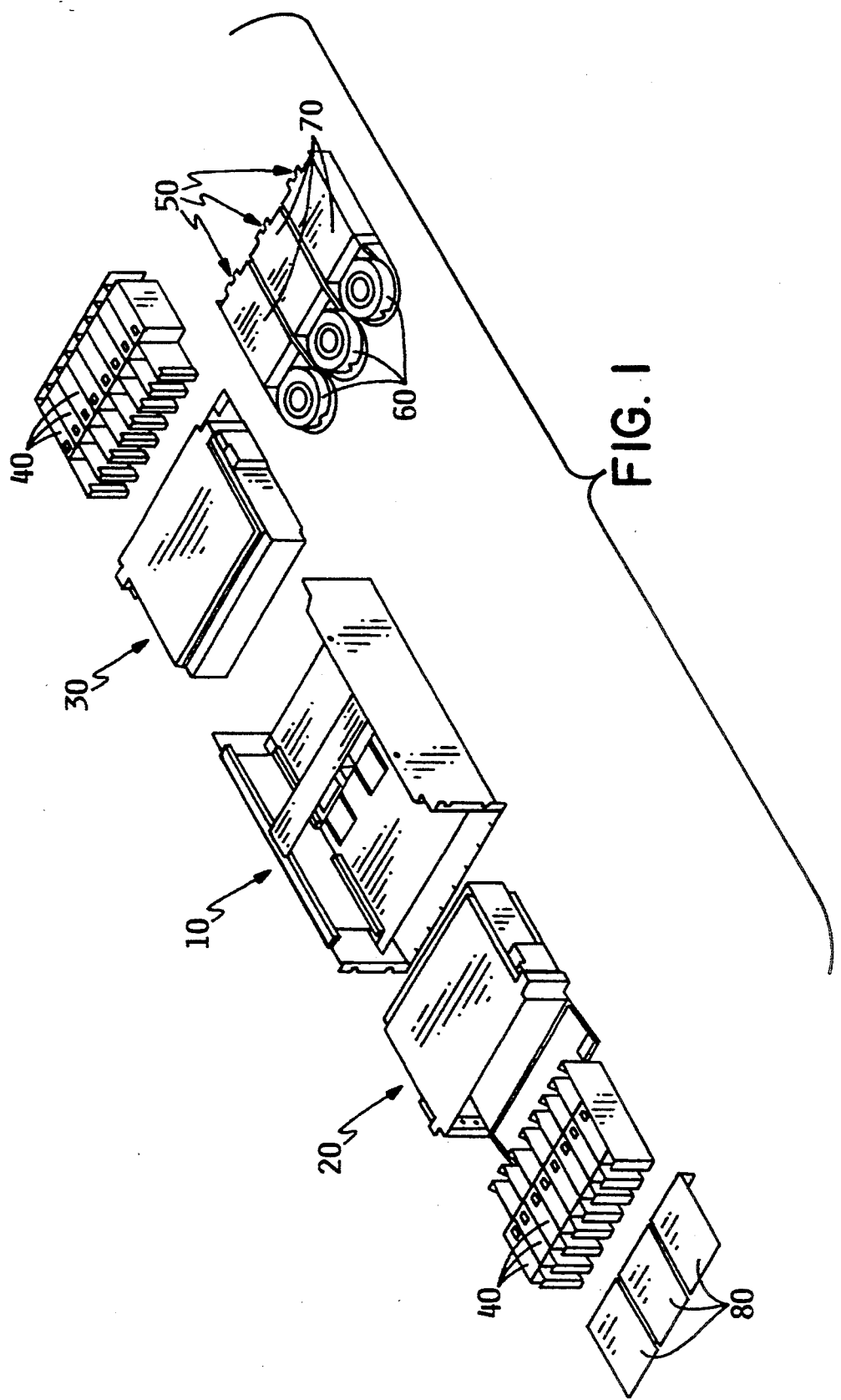
FIG. 1 is a front perspective view of a data storage subsystem with the main components shown in exploded formation.

Referring first to FIG. 1, there is shown a data storage subsystem comprising a chassis 10 in the form of a partially enclosed rectangular tube. The chassis is a support structure for a pair of disk pack modules 20,30 which are removably mountable in the chassis. Each disk pack module includes eight removable disk files 40. The storage subsystem further comprises three combined power supply and cooling units 50 each of which incorporates a cooling fan 60 and a power supply 70. Also shown in FIG. 1 are three sliding plates 80, the purpose of which will be explained below.

Figure 2:
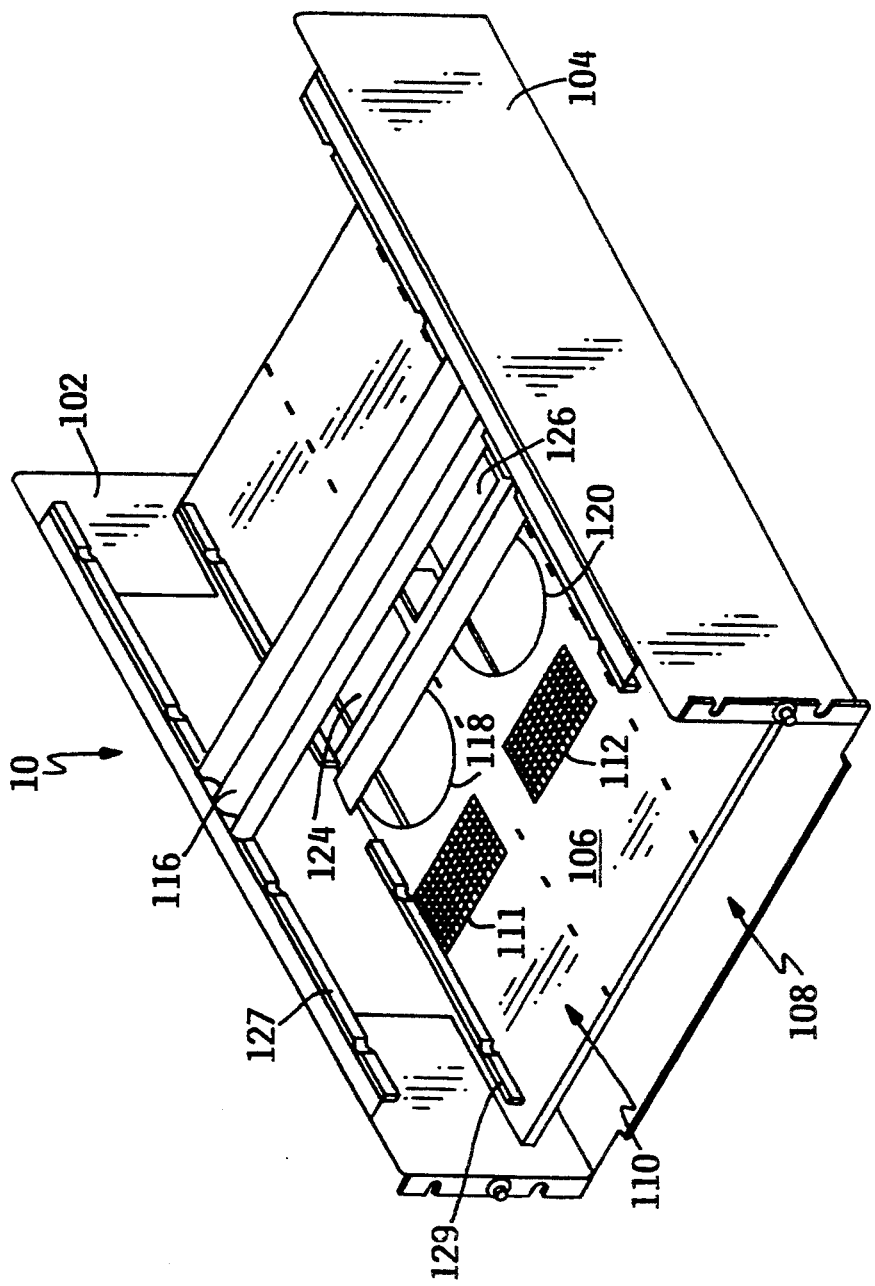
FIG. 2 is a front perspective view of the chassis of the data storage subsystem of FIG. 1.

As can be seen in FIG. 2, the chassis 10 includes two side walls 102,104. Extending between the two side walls is a longitudinally extending shelf 106 which divides the chassis into two main regions—a lower duct 108 and an upper duct 110. As can be seen to better effect in FIG. 8, included in the front section of the shelf are three grills 111, 112 and 113 which lie in front of three circular apertures 118, 120 and 122. Behind the circular apertures are three rectangular apertures 124, 126 and 128. The purpose of the grills and the circular and rectangular apertures will be explained below.

Figure 3:
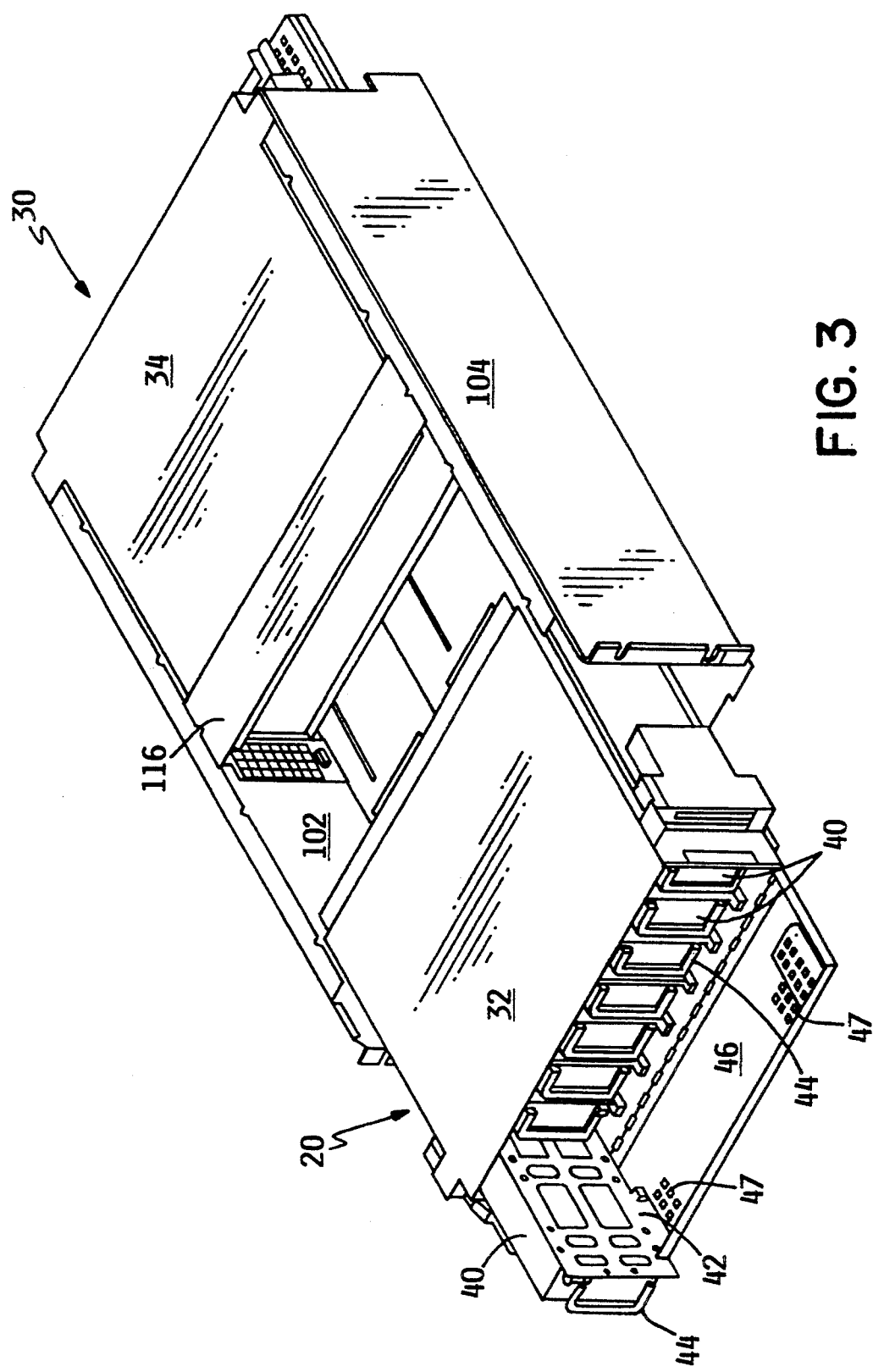
FIG. 3 is a front perspective view of the data storage subsystem of FIG. 1 with the front disk pack module shown in a partially inserted position.

Referring now to FIG. 3, the disk pack modules 20, 30 are each slidably mountable on runners (127 and 129 in FIG. 2) onto the chassis shelf. In FIG. 3, disk pack 20 is shown partially inserted into a front bay of the chassis and disk pack 30 is shown fully inserted into a rear bay of the chassis. When the modules are fully inserted, the top surfaces 32,34 of the modules cooperate with a central cross member 116 extending across the top of the chassis to form the top surface of the subsystem. Each disk pack module includes auto-docking connectors (not shown) which mate with corresponding connectors (also not shown) located within a central region of the upper duct which is defined between the respective rear faces of the modules.

Disk pack module 20 incorporates eight removable disk files 40, each of which is separately mounted onto a carrier 42 which is received by guide elements (not shown) within the module. Each disk file is designed to be "hot pluggable" in the sense that it may be individually removed and inserted from and to the module and hence from the subsystem without the need to shut down the operation of the subsystem. A handle 44 is provided at the front of each disk file which is used for removal and carrying purposes.

The disk pack module includes a front cover 46, shown open in FIG. 3, including a grill 47 extending across the whole surface area of the cover (only a portion of the grill is shown) which has the dual function of allowing cooling air to pass into the module while at the same time providing the necessary Radio Frequency Interference (RFI) screening.

Disk Pack module 30 which is mountable into the rear of the chassis is mechanically identical to disk pack module 20 and each module may therefore be inserted at either the front or rear of the chassis.

Figure 4:
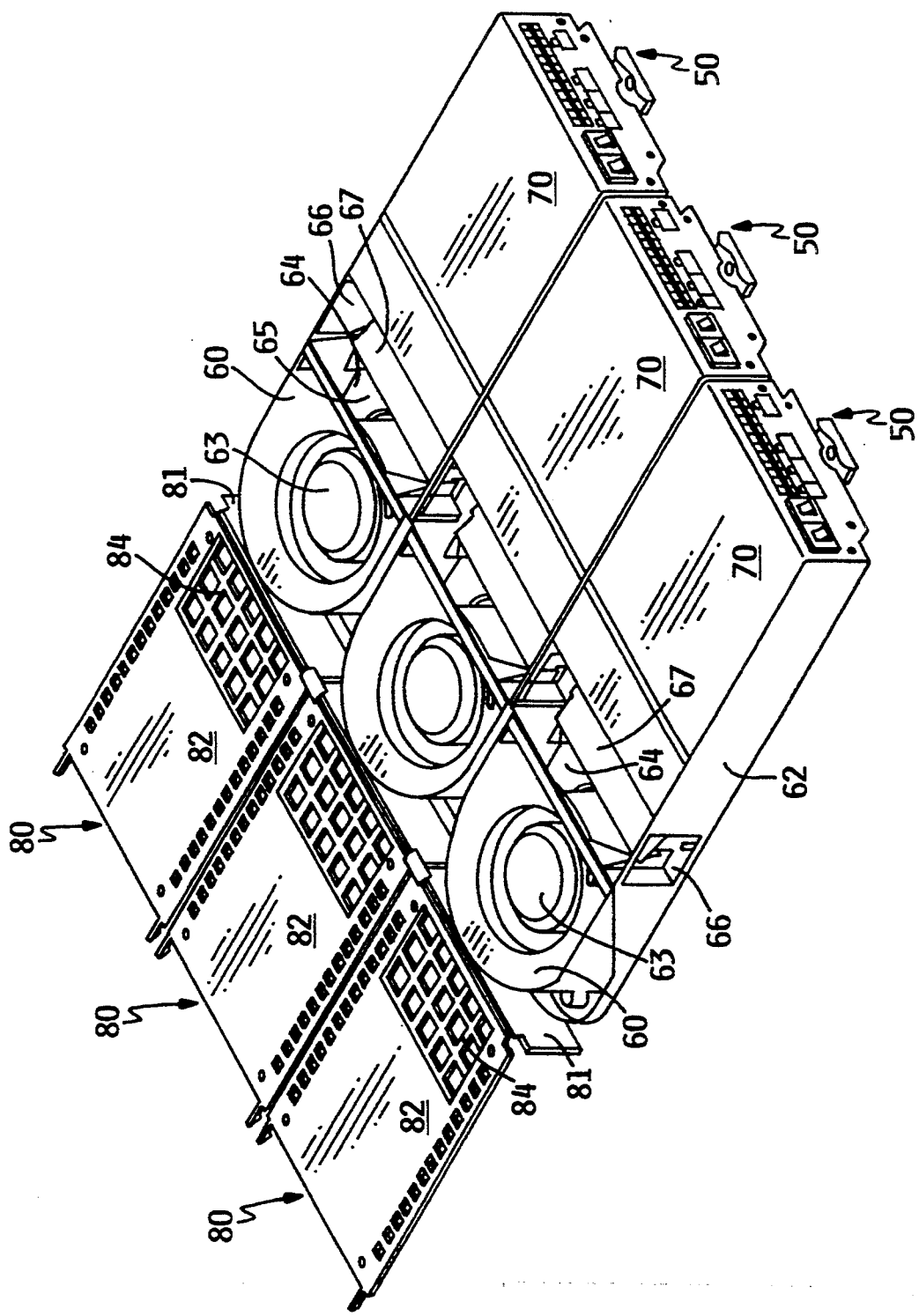
FIG. 4 is a rear perspective view of three combined power supply and cooling units.
Figure 5:
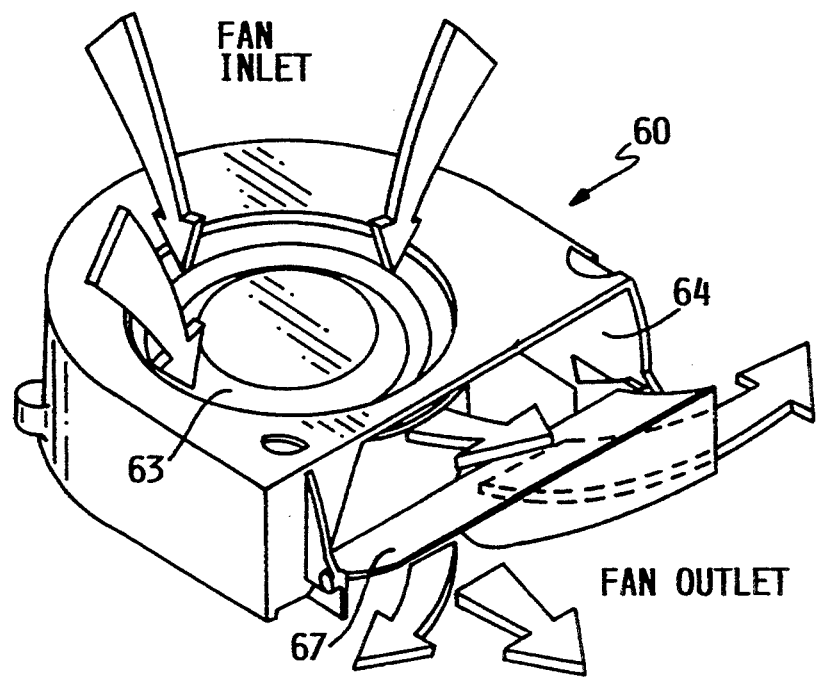
FIG. 5 shows a fan of one of the combined power supply and cooling units.

With reference to FIG. 4 there are shown three combined cooling and power supply units 50, each of which is removably mountable in the chassis. Each combined unit includes a forced air cooling fan, in the form of a centrifugal fan 60, which is horizontally mounted at one end of a tray 62. Mounted at the other end of the tray is a power supply unit 70 which along with the power supply units of the other two combined units, provides power to the whole subsystem, i.e., to the disk files and to the fans. The means by which each of the components of the subsystem is powered does not form part of this invention and will not be described further. The fan (one of which is shown in greater detail in FIG. 5) includes an upward facing inlet aperture 63 and an exhaust aperture 64 which faces towards the power supply. Separating the fan and the power supply is an exhaust plenum 65 defined between two side walls of the combined unit tray. The side walls include two apertures 66 which align with corresponding apertures in an adjacent combined unit. When in position within the chassis the plena of the three fans form a pressure equalization chamber extending across the width of the chassis. Hingeably mounted at the outlet aperture is a flap valve 67 which acts to close the fan outlet when the fan is non-operational.

The front of the combined unit includes a snap connector (indicated by reference numeral 68 in FIG. 7A) which fits into a connector positioned on the front face 81 of an L-shaped sliding plate 80. The horizontal portion of the plate 82 includes a grill 84.

Figure 6:
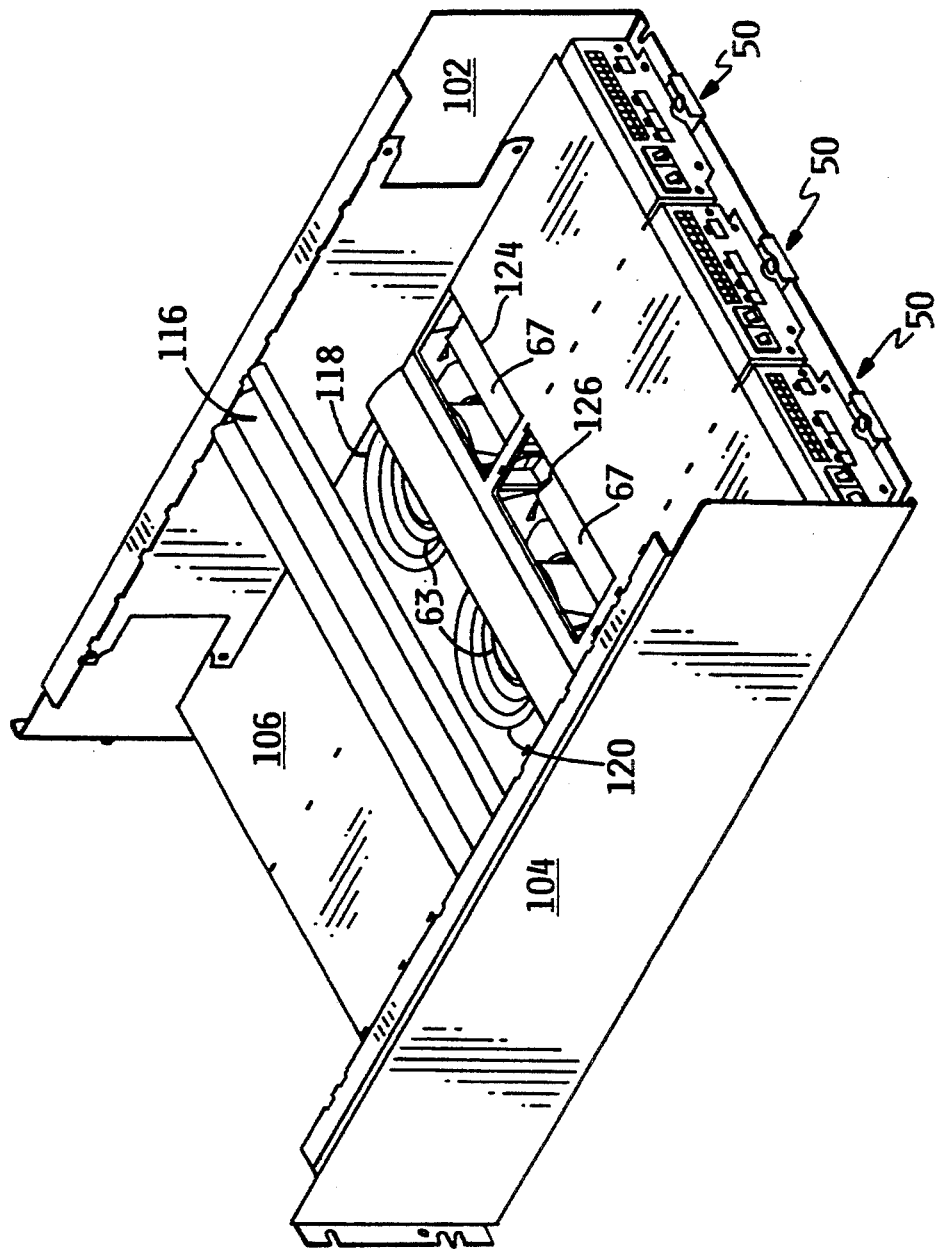
FIG. 6 is a rear perspective view of the data storage subsystem showing the combined power supply and cooling units in inserted position.

Referring to FIG. 6, when the combined unit is in position in the chassis, the fan is located centrally within the lower duct such that the fan inlet aperture 63 is aligned with one of the circular apertures 118, 120 in the chassis shelf. The aperture at the top of each fan plenum aligns with one of the rectangular apertures 124, 126 in the shelf. As can be seen in FIG. 7A, the sliding plate is located within the lower chassis duct with its horizontal upper surface adjacent the underside of the chassis shelf. When the combined unit is fully inserted in the chassis, grill 84 in the sliding plate 80 is aligned with one of the grills 111, 112 and 113 of the chassis shelf. When the combined unit is removed from the chassis, the sliding plate moves with the combined unit until it reaches a position within the lower duct such that it blocks off the corresponding circular aperture and the grill 84 is aligned with the corresponding rectangular aperture.

The provision of a horizontally mounted centrifugal fan in tandem with the power supply allows the power supply and fan to be removed together as a single field replaceable unit, thus allowing access to the fan 'buried' inside the machine. With this arrangement, the combined unit can be removed from the subsystem without disturbing the disk files or other cooling fans. Furthermore, the power supply provided to the subsystem through the power supply units can be readily arranged so that when one of the combined units is removed from the chassis while the subsystem is operational, the two remaining power supply units are capable of providing sufficient power for continued operation. In addition, the cooling provided to the subsystem may also be arranged such that on removal of one of the combined units, the remaining two fans are capable of providing sufficient cooling for the disk files and power supplies for the period of time required to replace the removed unit with a functioning unit. Thus by providing easy access to the fan and power supply and by ensuring that sufficient power and cooling capacity are provided on removal of a combined unit, the subsystem achieves the aim of allowing concurrent maintenance with high packaging density. For example, eight 3.5 inch form factor disk files per disk pack module plus associated power supplies and cooling fans can be accommodated within a chassis having dimensions of 665 mm×465 mm×171 mm.

As can be seen in FIG. 7A, in operation of the subsystem, air is drawn through the grill 47 in the front cover 46 of the front disk pack module, past the disk files 40 and exits the module via apertures at the back of the module. Cooling air is also drawn through the front of the subsystem into the lower duct 108 and is forced to travel upwards into the upper duct 110 through the grills in each of the three sliding plates and in the chassis shelf. The air from the lower duct combines with the air exiting the front disk pack module and is drawn downwards into the inlet aperture of the fan through the circular apertures 118,120,122 in the shelf.

Figure 8:
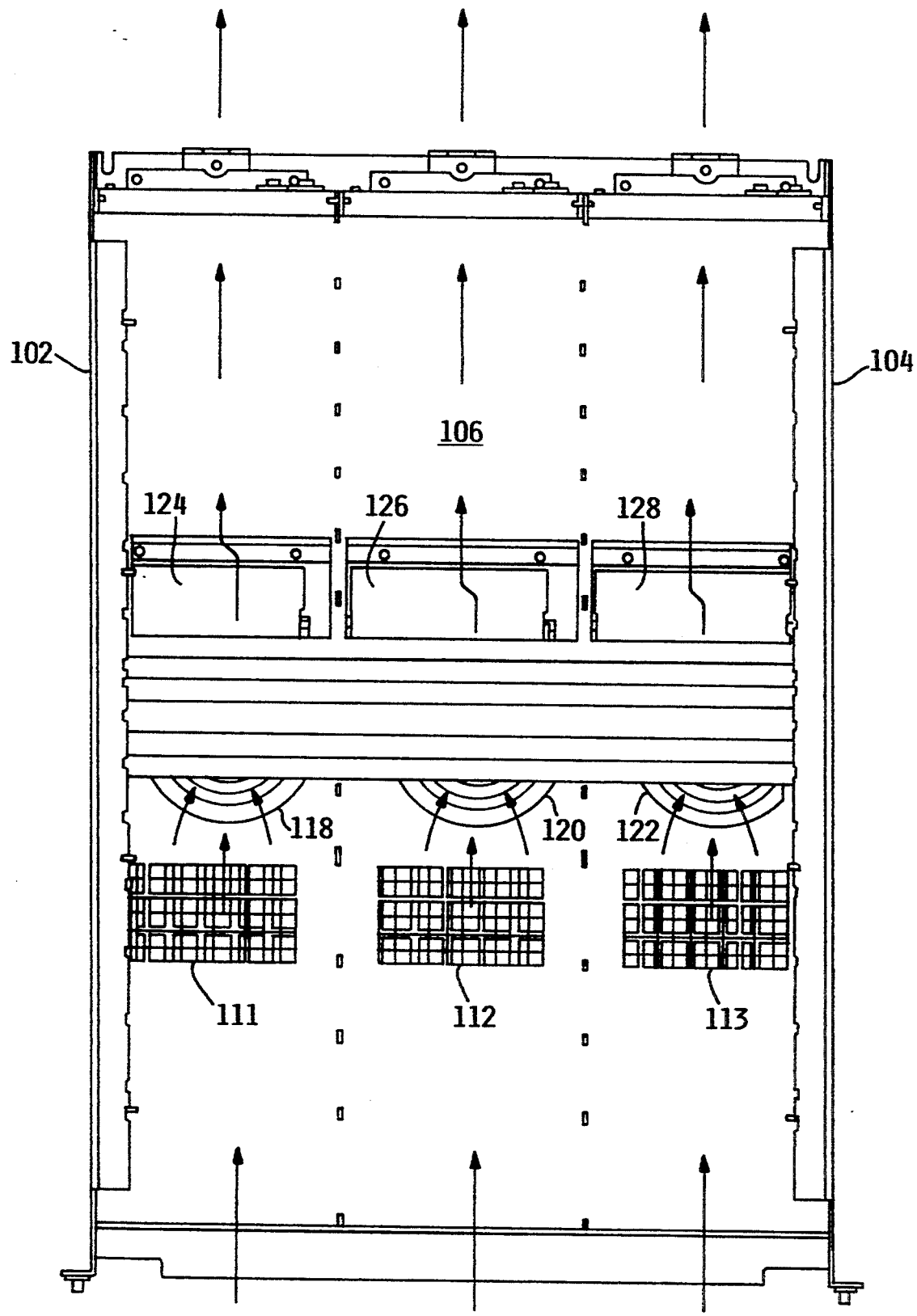
FIG. 8 is a top view of the subsystem of FIG. 1 showing the direction of cooling air flow through the chassis.

Air exiting the outlet aperture of the fan exhausts into the plenum and is deflected by the flap valve 67, which is held open by the pressure of air, towards the rear disk pack module. The pressure equalization chamber formed by the three adjacent fan plena 65 acts to distribute the air proportionally across the disk files mounted in the rear disk pack module. A portion of the air leaving the fan passes below the flap valve and is used to cool the power supply unit 70. The ratio of air passed to disk pack module and to the power supply is set by choosing the appropriate flap design. The air which is not deflected by the flap valve passes into the rear disk pack module and exits via the grill 47 in the cover plate 46. After serving to cool the power supply units, the smaller proportion of undeflected air exits via apertures (not shown) provided at the rear of the subsystem. FIG. 8 shows in plan view the passage of cooling air through the subsystem when all three combined power supply and fan units are in position. The disk pack modules are removed for the purposes of clarity.

As has already been described, when one of the combined power supply and fan units is not in position in the chassis as is shown in FIG. 7B, the circular aperture for that unit is blocked off by the sliding plate. Therefore, during operation of the subsystem, the air passing from the front portion of the chassis is drawn through the two remaining circular apertures into the two remaining fans. Because the rectangular aperture corresponding to the removed combined unit is still open, cooling air is able to exit the pressure equalization chamber through all three rectangular apertures. This ensures that cooling air is equally distributed amongst the disk files contained in the rear disk pack.

What is claimed is:

1. A modular housing for supporting first and second groups of replaceable heat-generating functional units, comprising:
   a chassis in the form of a rectangular tube having first and second openings at opposite ends thereof;
   a shelf extending longitudinally at least part way along the length of the chassis to form first and second ducts to accommodate the first and second group of functional units within the first duct on opposite sides of the chassis, the first duct having a front region to accommodate the first group of functional units and a rear region to accommodate the second group of functional units, so the first and second groups of functional units are respectively removable via the first and second openings; and
   a plurality of replaceable cooling units, which are removable via one of the chassis openings without removing either the first or second groups of functional units, the cooling units being arranged within the second duct in such a position that in operation they serve to draw air through the front region of the first duct, through the cooling units and through the rear region of the first duct.

2. The modular housing of claim 1, further comprising a plurality of replaceable power supply units arranged within the second duct of the chassis and removable via one of the chassis openings.

3. The modular housing of claim 2, wherein one of the cooling units is combined with one of the power supply units to form a single assembly, which is removable via one of the chassis openings.

4. The modular housing of claim 1, wherein each cooling unit further comprises:
   a centrifugal fan having an inlet and an outlet wherein the inlet receives cooling air from the direction of the first group of functional units; and
   deflection means arranged at the outlet to deflect a portion of the air exiting the fan from the outlet towards the second group of functional units.

5. The modular housing of claim 2, wherein each cooling unit further comprises:
   a centrifugal fan having an inlet and an outlet wherein the inlet receives cooling air from the direction of the first group of functional units; and
   deflection means arranged at the outlet to deflect a portion of the air exiting the fan from the outlet towards the second group of functional units.

6. The modular housing of claim 3, wherein each cooling unit further comprises:
   a centrifugal fan having an inlet and an outlet wherein the inlet receives cooling air from the direction of the first group of functional units; and
   deflection means arranged at the outlet to deflect a portion of the air exiting the fan from the outlet towards the second group of functional units.

7. The modular housing of claim 4 wherein the deflection means comprises a flap hingeably mounted at the outlet such that it covers the outlet aperture when the fan is not operating.

8. The modular housing of claim 6 wherein the deflection means comprises a flap hingeably mounted at the outlet such that it covers the outlet aperture when the fan is not operating.

9. A modular housing, comprising:
   a first group of replaceable heat-generating functional units contained in the housing;
   a second group of replaceable heat-generating functional units contained in the housing;
   a chassis in the form of a rectangular tube having first and second openings at opposite ends thereof;
   a shelf extending longitudinally at least part way along the length of the chassis to form first and second ducts to accommodate the first and second group of functional units within the first duct on opposite sides of the chassis, the first duct having a front region to accommodate the first group of functional units and a rear region to accommodate the second group of functional units, so the first and second groups of functional units are respectively removable via the first and second openings; and
   a plurality of replaceable cooling units, which are removable via one of the chassis openings without removing either the first or second groups of functional units, the cooling units being arranged within the second duct in such a position that in operation they serve to draw air through the front region of the first duct, through the cooling units and through the rear region of the first duct.

10. The modular housing of claim 9, wherein the functional units of each of the first and second group are removably loaded into a replaceable module.

11. The modular housing of claim 9, wherein the functional units of both the first and second group comprise data storage devices.

12. The modular housing of claim 10, wherein the functional units of both the first and second group comprise data storage devices.

* * * * *